United States Patent
Takeuchi et al.

(10) Patent No.: US 8,742,838 B2
(45) Date of Patent: Jun. 3, 2014

(54) STACKED STRUCTURE WITH A VOLTAGE BOOSTING SUPPLY CIRCUIT

(75) Inventors: Ken Takeuchi, Tokyo (JP); Tadashi Yasufuku, Tokyo (JP); Koichi Ishida, Tokyo (JP); Makoto Takamiya, Tokyo (JP); Takayasu Sakurai, Tokyo (JP)

(73) Assignee: The University of Tokyo, Tokyo (JP)

( * ) Notice: Subject to any disclaimer, the term of this patent is extended or adjusted under 35 U.S.C. 154(b) by 274 days.

(21) Appl. No.: 13/123,811

(22) PCT Filed: Apr. 17, 2009

(86) PCT No.: PCT/JP2009/057773
§ 371 (c)(1),
(2), (4) Date: Jul. 1, 2011

(87) PCT Pub. No.: WO2010/047140
PCT Pub. Date: Apr. 29, 2010

(65) Prior Publication Data
US 2011/0260781 A1 Oct. 27, 2011

(30) Foreign Application Priority Data
Oct. 20, 2008 (JP) ................................ 2008-270062

(51) Int. Cl.
H01L 25/00 (2006.01)
G05F 1/46 (2006.01)
H02M 3/145 (2006.01)
G11C 16/30 (2006.01)
G11C 5/14 (2006.01)

(52) U.S. Cl.
USPC ............................ 327/564; 327/536; 365/226

(58) Field of Classification Search
None
See application file for complete search history.

(56) References Cited

U.S. PATENT DOCUMENTS

| 7,619,945 B2 * | 11/2009 | Norman ........................ 365/226 |
| 7,869,240 B2 * | 1/2011 | Shimizu et al. .................. 365/51 |
| 7,894,230 B2 * | 2/2011 | Kim ................................ 365/51 |
| 2008/0009124 A1 | 1/2008 | Ishino et al. |
| 2008/0218155 A1 | 9/2008 | Huang et al. |

FOREIGN PATENT DOCUMENTS

| JP | A-2008-016720 | 1/2008 |
| JP | A-2008-071935 | 3/2008 |
| JP | A-2008-071953 | 3/2008 |
| JP | A-2008-158480 | 7/2008 |
| JP | A-2008-220147 | 9/2008 |
| TW | 200838141 | 9/2008 |

OTHER PUBLICATIONS

International Preliminary Report on Patentability issued in International Application No. PCT/2009/057773 dated May 17, 2011.
Tanaka et al., "Bit-Cost Scalable Technology for Low-Cost and Ultrahigh-Density Flash Memory," Toshiba Review, vol. 63, No. 2, pp. 28-31. (with English-Language abstract).
International Search Report issued in PCT/JP2009/057773, mailed Jun. 16, 2009. (with English-language translation).

* cited by examiner

*Primary Examiner* — Lincoln Donovan
*Assistant Examiner* — Terry L Englund
(74) *Attorney, Agent, or Firm* — Oliff PLC

(57) ABSTRACT

The interposer 30 is disposed on an upper surface of the stacked structure 24 formed by stacking a plurality of a DRAM chip 20 and a plurality of a flash memory chip 22. Thus down-size of an entire device is accomplished. A boost converter having an inductor is used as a voltage boost circuit 40. Thus down-size of the entire device is accomplished.

15 Claims, 13 Drawing Sheets

Fig. 11

| Cl [pF] | $T_{ON}$ [ns] | $T_{OFF}$ [ns] |
|---|---|---|
| 100 | 56.3 | 10.4 |
| 200 | 56.3 | 10.4 |
| 400 | 53.8 | 6.8 |
| 800 | 52.6 | 6.2 |

Fig. 12

| $V_{in}$ [V] | $T_{ON}$ [ns] | $T_{OFF}$ [ns] |
|---|---|---|
| 1.62 | 60.8 | 5.9 |
| 1.8 | 56.3 | 10.4 |
| 1.98 | 53.4 | 10.3 |

US 8,742,838 B2

STACKED STRUCTURE WITH A VOLTAGE BOOSTING SUPPLY CIRCUIT

TECHNICAL FIELD

The present invention relates to an integrated circuit device, for details, an integrated circuit device including a stacked structure formed by stacking a plurality of integrated circuit chips including a first integrated circuit chip having a first integrated circuit operated at a first voltage.

BACKGROUND ART

A proposed structure of an integrated circuit device includes a stacked structure formed by stacking f a plurality of flash memory chips having flush memory (see, for example, Non-Patent Document 1). This proposed integrated circuit device successively performs down-sizing the device by stacking a plurality of flash memory chips.

Non-Patent Document 1: Tanaka et al. "NAND-type flash Memory", TOSHIBA REVIEW, 2008. vol. 63 No 2. pp. 28-31.

DISCLOSURE OF THE INVENTION

In this prior art integrated circuit device, a voltage boosting supply circuit for boosting a power-supply voltage to a program-voltage for writing data is needed because the program-voltage, in the flash memory, is higher than a readout voltage for readout data. This voltage boosting supply circuit is needed for such a circuit that is formed by stacking a plurality of integrated circuit chips, for example, a mixed analog-digital chip having analog circuits and digital circuits operated by a different power-supply voltage from the analog circuits. So the voltage boosting supply circuit is generally formed in the integrated circuit chip. Forming the voltage boosting supply circuit in the integrated circuit makes an area of the integrated circuit larger. So it is difficult to perform down-sizing the entire device.

In an integrated circuit device, there would thus be a demand for down-sizing the entire device.

The present invention accomplishes at least part of the demand mentioned above and the other relevant demands by the following configurations applied to the integrated circuit device.

According to one aspect, the present invention is directed to an integrated circuit device including a stacked structure formed by stacking a plurality of integrated circuit chips including a first integrated circuit chip having a first integrated circuit operated at a first voltage. The integrated circuit device is characterized in that an interposer is disposed on an end surface of the stacked structure and has a voltage boosting supply circuit for boosting a specified voltage supplied from a power supply to the first integrated circuit chips forming the stacked structure.

In the integrated circuit device according to this aspect of the invention, the interposer is disposed on the one end surface of the stacked structure and has a voltage boosting supply circuit for boosting a specified voltage supplied from a power supply to the first integrated circuit chips forming the stacked structure. Thus down-size of the entire device is accomplished compared to a device having a voltage boosting supply circuit in a first integrated circuit.

In one preferable application of the integrated circuit device according to the above aspect of the invention, the voltage boosting supply circuit has a boost converter having an inductor connected in series between an input terminal supplied with the specified voltage and an output terminal supplying the first voltage, a rectifying element connected in series between the inductor and the output terminal and rectifying current to an direction from the input terminal to the output terminal, a switching element connected between the inductor and the rectifying element and connected in parallel with the output terminal as viewed from the inductor, a capacitor connected between the rectifying element and the output terminal and connected in parallel with the output terminal as viewed from the rectifying element, and a resistor connected between the rectifying element and the output terminal and connected in parallel with the output terminal as viewed from the rectifying element and a switching control circuit controlling switching of the switching element. Thus down-size of the entire device is accomplished compared to a device having a voltage boosting supply circuit in a first integrated circuit. Thus down-size of the entire device is accomplished even if the integrated circuit has a boost converter as the voltage boosting supply circuit.

In the integrated circuit device that the voltage boosting supply circuit has the boost converter and the switching control circuit according to this aspect of the invention, the switching control circuit controls the switching element so that the switching of the switching element is performed at a frequency adjusted for varying a voltage of the output terminal into the first voltage. The higher the voltage of the output terminal is, the slower the voltage rises. This arrangement desirably boost the specified voltage supplied from a power supply to the first voltage. The switching control circuit controls the switching element so that the switching of the switching element is performed at a frequency adjusted to a tendency to rise by rising of the voltage of the output terminal. The switching control circuit controls the switching element so that the switching of the switching element is performed at a first frequency while the voltage of the output terminal varies from the specified voltage to a first control voltage that is higher than the specified voltage and lower than the first voltage, controls the switching element so that the switching of the switching element is performed at a second frequency that is higher than the first frequency during the time between when the voltage of the output terminal reaches the first control voltage and when the voltage of the output terminal reaches the second control voltage that is higher than the first control voltage and lower than the first voltage, controls the switching element so that the switching of the switching element is performed at a third frequency that is higher than the second frequency during the time between when the voltage of the output terminal reaches the second control voltage and when the voltage of the output terminal reaches the first voltage, controls the switching element so that the switching of the switching element is stopped after the voltage of the output terminal reaches the first voltage, and controls the switching element so that the switching of the switching element is performed at the third frequency while the voltage of the output terminal varies to the first voltage when the voltage of the output terminal reduces to the second control voltage after reaching the first voltage. The switching control circuit controls the switching element so that the switching of the switching element is performed at a first frequency while the voltage of the output terminal varies from the specified voltage to the first control voltage, controls the switching element so that the switching of the switching element is performed at the second frequency during the time between when the voltage of the output terminal reaches the first control voltage and when the voltage of the output terminal reaches the second control voltage, and controls the switching element so that the switching of the switching element is performed at the third frequency during the time between when the voltage of the output terminal reaches the second control voltage and when the voltage of the output terminal reaches the first voltage. The voltage of the output terminal is boosted relatively rapidly till the voltage of the output terminal becomes the first control voltage, boosted slower till the voltage of the output terminal becomes the second control voltage than till the voltage of the output terminal becomes the first control voltage, and boosted slower till the voltage of the output terminal becomes the first voltage than till the voltage of the output terminal becomes the second control voltage. This arrangement desirably boost the specified voltage supplied from a power supply to the first voltage. The switching control circuit controls the switching element so that the switching of the switching element is performed at the third frequency when the voltage of the output terminal reduces to the second control voltage after reaching the first voltage. This arrangement desirably gets the voltage of the output terminal back to the first voltage even if the voltage of the output terminal reduces from the first voltage.

In the integrated circuit device according to this aspect of the invention, the voltage boosting supply circuit includes: a boost converter having an inductor connected in series between an input terminal supplied with the specified voltage and an output terminal supplying the first voltage, a rectifying element connected in series between the inductor and the output terminal and rectifying current to an direction from the input terminal to the output terminal, and a switching element connected between the inductor and the rectifying element and connected in parallel with the output terminal as viewed from the inductor; and a switching control circuit controlling switching of the switching element by using a pulse signal. Thus down-size of the entire device is accomplished even if the integrated circuit has a boost converter as the voltage boosting supply circuit.

In the integrated circuit device that the voltage boosting supply circuit has the boost converter and the switching control circuit controlling the switching of the switching element using the pulse signal according to this aspect of the invention, the switching control circuit includes: a voltage detection unit for detecting an output voltage that is the voltage of the output terminal; voltage varying amount detection unit detecting a varying amount of the output voltage when one period amount of the pulse signal is applied to the switching element; and a switching control unit deducing a load capacitance connected with the output terminal by using a frequency and a duty ratio of the pulse signal, the detected output voltage and the detected varying amount of the output voltage, and for controlling the switching of the switching element by using a pulse signal with a frequency and a duty ratio adjusted so that the output voltage becomes the first voltage and the boost converter can be driven efficiently with respect to the deduced load capacitance. This arrangement desirably suppresses the increase of a consumed power of the boost converter by fluctuation the load capacitance connected with the output terminal. In this case, the switching control circuit includes a first memory unit storing a deducing load capacitance that is the deduced load capacitance, the detected output voltage, and the frequency and the duty ration of the pulse signal; and a second memory unit storing a preset specified relationship with respect to the load capacitance and the output voltage that is a relationship of the frequency and the duty ratio of the pulse signal with energy consumed by the boost converter becoming a relatively low value thereat until the output voltage becomes the first voltage, and the switching control unit, until the detected output voltage becomes the first voltage, deduces a voltage varying amount of the output terminal when the switching of the switching element is controlled with a load having the deduced capacitance stored in the first memory connected with the output terminal using the pulse signal with the frequency and the duty ratio stored in the first memory, controls the switching of the switching element by using a pulse signal with the frequency and the duty ratio stored in the first memory and stores the detected output voltage in the first memory when a difference between the detected voltage varying amount and the deduced voltage varying amount of the output terminal is lower than a specified value, deduces the load capacitance by using the detected voltage varying, sets the frequency and the duty ratio of the pulse signal with the boost converter being driven efficiently thereat by using the deduced load capacitance and the specified relationship stored in the second memory, controls the switching of the switching element by using a pulse signal with the set frequency and the set duty ratio, and stores the deduced load capacitance, the frequency and the duty ration of the pulse signal and the detected output voltage in the first memory; and the switching control unit stops the switching of the switching element after the voltage of the output terminal reaches the first voltage.

In the integrated circuit device that the voltage boosting supply circuit has the boost converter and the switching control circuit controlling the switching of the switching element using the pulse signal according to this aspect of the invention, the switching control circuit includes a voltage detection unit for detecting a voltage of the input terminal and the switching control unit controls the switching of the switching element by using a pulse signal with a frequency and a duty ratio adjusted with respect to the detected voltage so that the boost converter can driven efficiently. This arrangement desirably boosts efficiently regardless of the fluctuation of the voltage of the input terminal.

In the integrated circuit device that the voltage boosting supply circuit has the boost converter and the switching control circuit controlling the switching of the switching element using the pulse signal according to this aspect of the invention, the switching element is an enhancement-type n-type metal oxide semiconductor transistor having a drain is connected with the inductor and having a source is grounded. The switching element includes: a depletion-type n-type metal oxide semiconductor transistor having a drain connected with the inductor; and an enhancement-type n-type metal oxide semiconductor transistor having a drain connected with a source of the depletion-type n-type metal oxide semiconductor transistor and a source grounded. The rectifying element is an enhancement-type n-type metal oxide semiconductor transistor having a gate and a source connected with the inductor and a drain connected with the capacitor.

In one preferable application of the integrated circuit device according to this aspect of the invention, the first integrated circuit is a flash memory. This arrangement desirably down-sizes the entire device even if the first integrated circuit is the flash memory.

In another preferable application of the integrated circuit device according to this aspect of the invention, the first integrated circuit operates at the first voltage and a second voltage deferent from the first voltage; and the interposer has a second voltage boosting supply circuit boosting the specified voltage to the second voltage and supplying to the first integrated circuit of the first integrated circuit chip forming the stacked structure. This arrangement desirably down-sizes the entire device even if the first integrated circuit operates at the first voltage and the second voltage deferent from the first voltage.

In one preferable application of the integrated circuit device according to this aspect of the invention, the stacked structure has a second integrated circuit chip having a second integrated circuit operated at a second voltage deferent from the first voltage; and the interposer has a second voltage boosting supply circuit boosting the specified voltage to the second voltage and supplying to the second integrated circuit of the second integrated circuit chip forming the stacked structure. This arrangement desirably down-sizes the entire device even if the stacked structure has the second integrated circuit chip having the second integrated circuit operated at the second voltage deferent from the first voltage.

BRIEF DESCRIPTION OF THE DRAWINGS

FIG. 2 schematically illustrates the configuration of a voltage boosting circuit 40 that an interposer 30 is equipped with.

FIG. 11 schematically illustrates of a relationship of the load capacitance Cl, the on time Ton and the off time Toff that the consumption energy Ebo becomes a minimum value Emin at during maintaining the input voltage Vin (for example, 1.8V);

FIG. 12 schematically illustrates of a relationship of the load capacitance Cl, the on time Ton and the off time Toff that the consumption energy Ebo becomes a minimum value Emin at during maintaining the load capacitance Cl (for example, 100 pF);

BEST MODES OF CARRYING OUT THE INVENTION

One mode of carrying out the invention is described below as a preferred embodiment.

Figure 1:
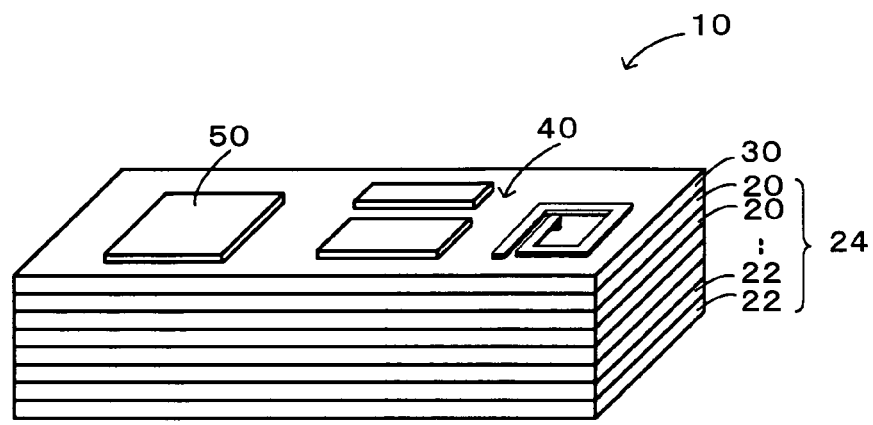
FIG. 1 schematically illustrates the configuration of an integrated circuit device 10 that a SS is equipped with as an internal storage of a computer of one embodiment of the invention.

FIG. 1 schematically illustrates the configuration of an integrated circuit device 10 that a SSD (Solid State Disk) is equipped with as an internal storage of a computer of one embodiment of the invention. The integrated circuit device 10 has a stacked structure 24 formed by stacking a plurality of a DRAM (Dynamic Random Access Memory) chip 20 that is a silicon chip formed DRAM and a plurality of a flash memory chip 22 that is a silicon chip formed NAND-type flash memory, and an interposer 30 disposed on an upper surface of the stacked structure 24. The integrated circuit device 10 is supplied a voltage V1 (for example, 1.8V) as a power-supply voltage from an external power supply not illustrated. In this embodiment, DRAM chip 20 is operated at the voltage V1. A program-voltage for writing of the NAND-type flash memory is the voltage V1 and a readout voltage of the NAND type flash memory is a voltage V2 (for example, 20V). Through holes (not illustrated) are formed in the DRMA chip 22 and the flash memory chip 22 and pierce from a top surface of the chip to a back surface of the chip. The DRAM chip 20 is connected electrically with the flash memory chip 22 via a connecting wire formed by filling into the through hole with a metallic material with higher conductive material (for example, copper etc.).

Figure 2:
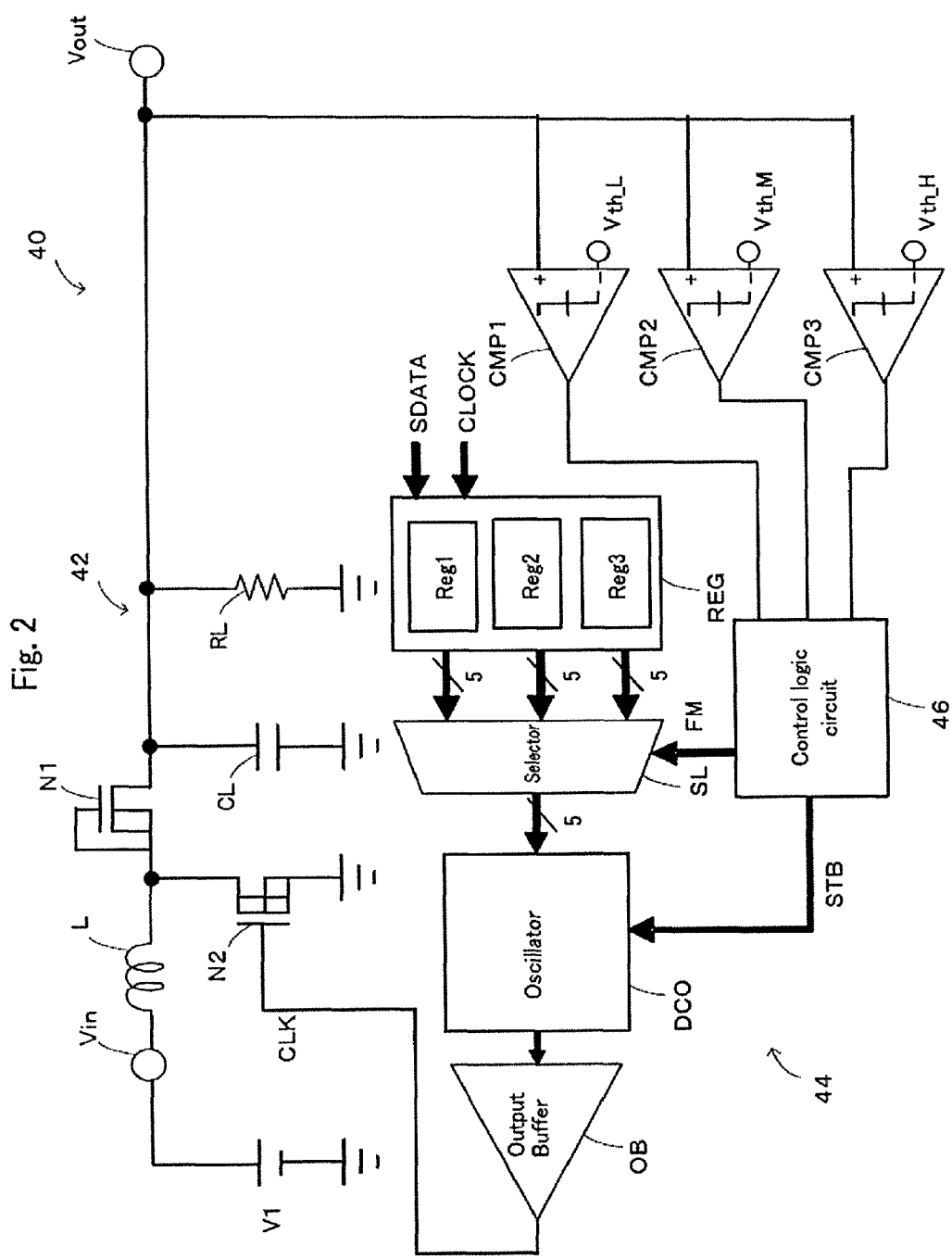

The interposer 30 has a voltage boosting circuit 40 Boosting the voltage V1 supplied from the power-supply to the voltage V2 to supply the voltage to the flash memory of the flash memory chip 22, a memory controller 50 controlling the DRAM and the flash memory, a connecting wire (not illustrated) from the voltage boosting circuit 40 or from the memory controller 50 and so on. FIG. 2 schematically illustrates the configuration of the voltage boosting circuit 40 that an interposer 30 is equipped with. The voltage boosting circuit 40 has a boost converter 42 boosting a voltage V1 supplied from an input terminal Vin and outputting a boosted voltage to the flash memory from an output terminal Vout, and a switching control circuit 44 controlling the boost converter 42. The boost converter 42 has an inductor L connected in series between the input terminal Vin supplied the voltage V1 and the output terminal Vout outputting the voltage V2, an enhancement-type NMOS (N-channel Metal Oxide Semiconductor) transistor N1 (described below as a transistor N1) having a gate, a source connected with the gate and connected with the inductor L and a drain connected with the output terminal Vout, a depletion-type NMOS transistor N2 (described below as a transistor N2) connected in parallel with the output terminal Vout between the inductor L and the transistor N1 from a side of the inductor L, and capacitance CL and resistance RL connected in parallel with the output terminal Vout between the transistor N1 and the output terminal Vout from a side of the transistor N2. The switching of the transistor N2 is controlled by a clock signal CLK output from the switching control circuit 44.

The switching control circuit 44 has an oscillator DCO outputting the clock signal CLK, an output buffer OB inputting the clock signal CLK to the gate of the transistor N2 at a proper timing, comparators CMP1-CMP3 comparing the voltage of the output terminal with a threshold Vth_L, Vth_M and Vth_H (for example, respectively, 15V, 18V, 20V etc.), a control logic circuit 46 outputting a frequency mode FM of the clock signal CLK output from the oscillator DCO in response to a comparison result input from the comparators CMP1-CPM3 and a stand-by signal STB for quitting an operation of the oscillator DCO, a register REG storing an on and off information of switches SW1-SW5 of the oscillator DCO in response to the frequency mode FM, and a selector SL reading out the information of the switches of the oscillator DCO in response to the input frequency mode FM and switching the switches of a second circuit M2 and a third circuit M3 described below of the oscillator DCO. The configuration and the operation of the oscillator DCO is described below. The explanation using FIG. 2 is stopped. The explanation using FIGS. 3 and 4 is performed.

Figure 3:
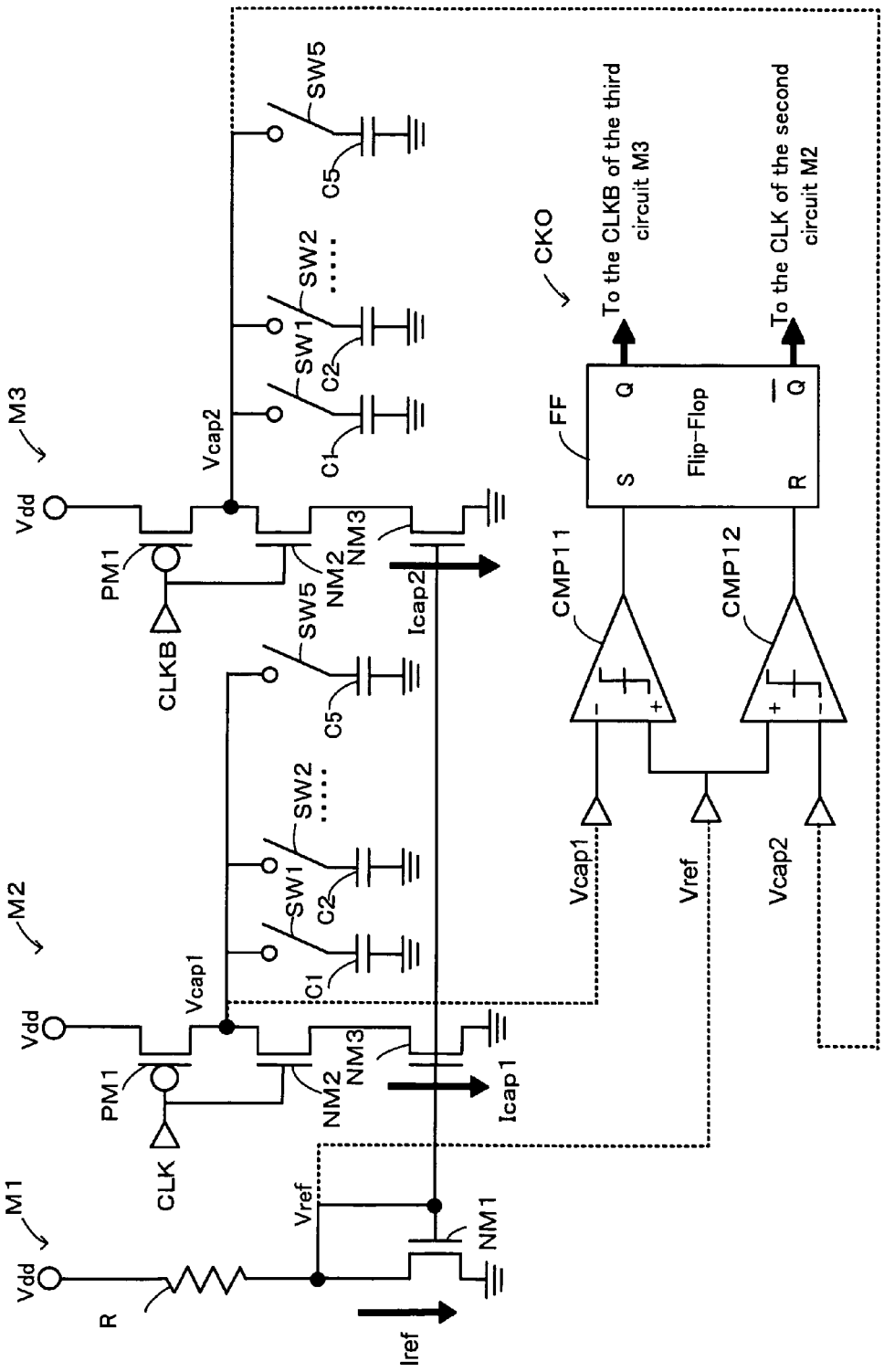
FIG. 3 schematically illustrates the circuit of an oscillator DCO.
Figure 4:
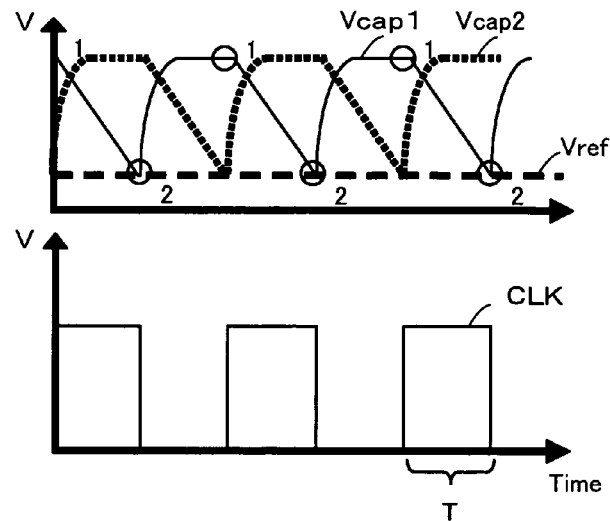
FIG. 4 schematically illustrates of time variation of a clock signal CLK output from the oscillator DCO.

FIG. 3 schematically illustrates the circuit of an oscillator DCO. FIG. 4 schematically illustrates of time variation of a clock signal CLK output from the oscillator DCO. As illustrated in FIG. 3, the oscillator DCO has a first circuit M1 configured as a constant current circuit, the second circuit M2 and the third circuit M3 configured to be a current mirror in conjunction with the first circuit M1, and a clock signal output circuit CKO generating and outputting the clock signal CLK using an output of the first circuit M1 and second circuit M2. The first circuit M1 has a resistor R and a NMOS transistor NM1 having a drain supplied a power-supply voltage Vdd (in this embodiment, the voltage V1) thereto via the resistor R, a gate connected with the drain, and a source grounded. The second circuit M2 has a PMOS (P-channel Metal Oxide Semiconductor) transistor PM1 has a source supplied the power-supply voltage thereto, a NMOS transistor NM2 having a gate and a drain connected with a gate and a drain of the transistor PM1 respectively, and a NMOS transistor NM3 having a gate connected with the gate of the transistor NM1 and a drain connected with the source of the transistor NM2. The third circuit M3 is the same configuration as the second circuit M2. A capacitance C1-C5 is connected in parallel with each other between the drain of the transistor PM1 of the second circuit M2 and the third circuit M3 and a ground via the switch SW1-SW5. The clock signal output circuit CKO has a comparator CMP11 comparing a reference voltage Vref that is a voltage between the drain of the transistor NM1 and the ground to a voltage between the drain of the transistor PM1 of the second circuit M2 and the ground, i.e., a capacitance voltage Vcap1 that is a voltage between electrodes of the capacitance C1-C5 and outputting a comparison result, a comparator CMP12 comparing the reference voltage Vref to a voltage between the drain of the transistor PM1 of the third circuit M3 and the ground, i.e., capacitance voltage Vcap2 that is a voltage between electrodes of the capacitance C1-C5 and outputting a comparison result, and a flip-flop FF set or reset in response to the comparison results from comparators CMP11 and CMP12. The flip-flop FF is set and outputs a signal with a low level logic voltage as the clock signal CLK when the capacitance voltage Vcap1 is equal to or higher than the reference voltage Vref. The flip-flop FF is reset and outputs a signal with a high level logic voltage as the clock signal CLK when the capacitance voltage Vcap2 is equal to or higher than the reference voltage Vref. The flip-flop FF outputs a clock signal CLKB having a phase the reverse of the clock signal CLK. The oscillator DCO has a transistor (not illustrated) fixing a voltage of the clock signal with a low level logic voltage in response to being input a stand-by signal STB from the control logic circuit 46.

An oscillation action of the oscillator DCO is described below. FIG. 4 schematically illustrates of time variation of the reference voltage Vref, the capacitance voltages Vcap1 and Vcap2, and a voltage of the clock signal CLK. The first circuit M1, the second circuit M2 and the third circuit M3 are configured to form a current mirror. Thus a current Iref flowing through the first circuit M1, a current Icap1 flowing through the second circuit M2 and a current Icap2 flowing through the third circuit M3 is equal to each other. The reference voltage Vref is a constant voltage and is calculated using a formula (1) described below. In the formula (1), an R value is a resistance of the resistance R. As illustrated in FIG. 4, a capacitance connected with a switch turned on of the switches SW1-SW5 begins to discharge and the capacitance voltage Vcap1 of the second circuit M2 falls down to be in the same state as the reference voltage Vref (a state of "2" in FIG. 4) when the capacitance voltage Vcap1 is in the same state as the power-supply voltage (a state of "1" in FIG. 4). The current Icap1 is constant and the capacitance voltage Vcap1 falls down at a constant time varying rate. The clock signal CLK output from the flip-flop FF becomes a low level voltage, the clock signal CLKB becomes a high level voltage, a capacitance connected with a switch turned on of the switches SW1-SW5 of the third circuit M3 begins to discharge, and the capacitance voltage Vcap2 falls down to be in the same state as the reference voltage Vref (a state of "1" in FIG. 4) when the capacitance voltage Vcap1 is lower than the reference voltage Vref. In the second circuit M2, the capacitance connected with a switch turned on is charged and the capacitance voltage Vcap1 rises. The clock signal CLK output from the flip-flop FF becomes the high level voltage, and the clock signal CLKB becomes the low level voltage when the capacitance voltage Vcap2 falls down to be in the same state as the reference voltage. Thus the oscillator DCO oscillates to generate the clock signal CLK. A time T that is the time for discharging a capacitance connected with a switch turned on of the switches SW1-SW5, that is, a half cycle T of the clock signal CLK is calculated using the following formula (2) and is derived from the formula (1) and (3). In the formula (2) and (3), a value C shows a synthesized capacitance of the capacitance connected with a switch turned on of the switches SW1-SW5 of the second circuit M2 or the third circuit. Thus a frequency of the clock signal CLK output from the oscillator DCO is decided by the resistance value R of the resistance R and the synthesized capacitance of the capacitance connected with a switch turned on of the switches SW1-SW5 of the second circuit M2 or the third circuit. The clock signal CLK with a several kinds of frequencies can be output by selecting a combination of a switch turned on of the switches SW1-SW5. In this embodiment, the second circuit M2 is the same configuration as that of the third circuit M3. A duty ratio (that is a cycle time 2T divided by a time that the clock signal CLK becomes the high voltage for) of the clock signal CLK is about 0.5. The oscillator is described.

$$Vref = Vdd - Iref \cdot R \quad (1)$$

$$T = (Vdd - Vref) \cdot C / Icap1 \quad (2)$$

$$T = RC \quad (3)$$

One mode of carrying out the invention is described again using FIG. 2. The control logic circuit 46 sets the frequency mode FM to a value 0 showing relatively low frequency f0 (for example, 10 MHz) when the output voltage Vout is equal to or higher than 0 V and is equal to or lower than the threshold Vth_L. The control logic circuit 46 sets the frequency mode FM to a value 1 showing frequency f1 (for example, 13.5 MHz) that is higher than the frequency f0 when the output voltage Vout is higher than the threshold Vth_L and is equal to or lower than Vth_M. The control logic circuit 46 sets the frequency mode FM to a value 2 showing frequency f2 (for example, 20 MHz) that is higher than the frequency f1 when the output voltage Vout is higher than the threshold Vth_M and is equal to or lower than Vth_H. The control logic circuit 46 output the stand-by signal STB to the oscillator DCO when the output voltage Vout is higher than the threshold Vth_H.

The register REG has registers Reg1, Reg2 and Reg 3 inside. The registers Reg 1, Reg 2 and Reg 3 store on and off information of the switches SW1-SW5 with respect to each value of the preset frequency mode FM. As is evident from the formula (3) described above, the smaller the value of the frequency mode FM is and the lower the frequency of the clock signal CLK that should be output from the oscillator DCO is (the longer the cycle time is), the bigger the synthesized of capacitances C1-C5 connected with the oscillator DCO is needed to be. The on and off information of each switch is stored in registers Reg 1, Reg 2 and Reg 3 so that the synthesized of capacitances C1-C5 connected with the oscillator DCO is bigger when the value of the frequency mode FM is smaller.

A selector SL, in response to an input of the frequency mode FM from the control logic circuit 46, reads out on and off information of each switch that correspond to the input value of the frequency mode FM and turn on or turn off switches SW1-SW5 of the oscillator DCO so that switches SW1-SW5 is turned on or turned off just like the information read out from the register REG. The register REG is configured to rewrite the on or off information of switched SW1-Sw5 stored in the register REG by using serial data SDATA input coincident with the clock signal CLOCK from external device. The register REG can change the frequency of the clock signal CLK output from the oscillator DCO by rewriting the information stored in the register REG even after the on or off information of each switch is stored in the register REG.

Figure 5:
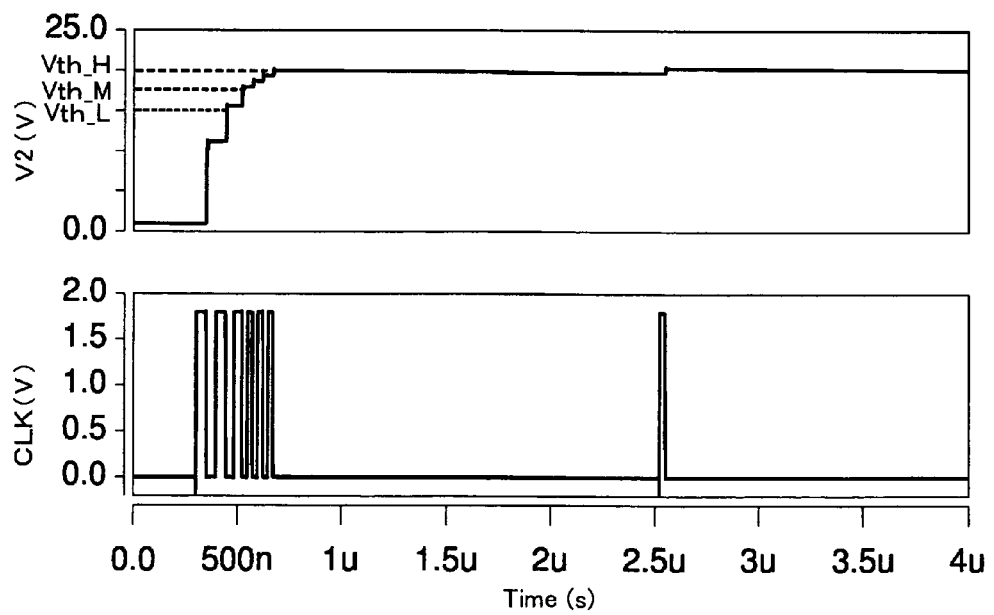
FIG. 5 schematically illustrates of time variation of a voltage V2 output from the voltage boosting circuit 40 and of a clock signal CLK output from a switching control circuit 44.

An operation of the voltage boosting circuit 40 is described below. FIG. 5 schematically illustrates of time variation of the voltage V2 output from the voltage boosting circuit 40 and of the clock signal CLK output from the switching control circuit 44. The voltage boost operation begins in response to supply the voltage V1 to the input terminal Vin. The frequency mode FM of value 0 is output from the control logic 46 to the selector SL until the voltage Vout of the output terminal Vout is higher than the threshold Vth_L. The selector SL input the frequency mode FM of value 0 reads out the on or off information from the register REG in the frequency mode FM of value 0 and switch over on or off of switches SW1-SW5 of the second circuit M2 and the third circuit M3 of the oscillator DCO. Thus the clock signal CLK of the frequency f0 is input the gate of the transistor N2 of the boost convertor 42 from the oscillator DCO via the output buffer OB in response to switching over switches SW1-SW5. The transistor N2 is switched by the clock signal CLK of the frequency f0. This arrangement enables the voltage Vout of the output terminal Vout to rise relatively rapidly. The frequency mode FM of value 1 is output from the control logic circuit 46 to the selector SL when the voltage Vout rises to reach the threshold Vth_L. The selector SL reads out the on or off information of each switch at the time when the frequency mode FM is value 1 from the register REG and switches over on or off of switches SW1-SW5 of the second circuit M2 and the third circuit M3. Thus the clock signal CLK of the frequency f1 is input the gate of the transistor N2 of the boost convertor 42 from the oscillator DCO via the output buffer OB in response to switching over switches SW1-SW5. The transistor N2 is switched by the clock signal CLK of the frequency f1 higher than the frequency f0. This arrangement enables the voltage Vout of the output terminal Vout to rise higher. The voltage Vout rises slowly because the frequency f1 is higher than the frequency f0. The frequency mode FM of value 2 is output from the control logic circuit 46 to the selector SL when the voltage Vout rises to reach the threshold Vth_M. The selector SL reads out the on or off information of each switch at the time when the frequency mode FM is value 2 from the register REG and switches over on or off of switches SW1-SW5 of the second circuit M2 and the third circuit M3. Thus the clock signal CLK of the frequency f2 is input the gate of the transistor N2 of the boost convertor 42 from the oscillator DCO via the output buffer OB in response to switching over switches SW1-SW5. The transistor N2 is switched by the clock signal CLK of the frequency f2 higher than the frequency f1. This arrangement enables the voltage Vout of the output terminal Vout to rise higher. The voltage Vout rises slowly because the frequency f2 is higher than the frequency f1. The stand-by signal STB is output from the control logic circuit 46 when the voltage Vout rises to reach the threshold Vth_H (is equal to the voltage V2). The oscillation action of the oscillator DCO input the stand-by signal STB is stopped, a rise of the voltage Vout is stopped, and the voltage boost operation of the voltage boosting circuit 40 is stopped. This operation enables the voltage V1 supplied to the input terminal Vin to being rise by the voltage V2. The closer the output voltage Vout reaches to the voltage V2, the higher the oscillation frequency of the oscillator DCO is made to be. This enables the output voltage Vout to being boosted slower. This arrangement desirably boosts the input voltage Vin to the voltage V2. Thus the voltage Vout begins to fall down gradually in response to a stop of boost operation. The oscillator DCO begins to do the oscillation action again when the voltage Vout is lower (in the figure, the time when it is 2.6 micro seconds) than the threshold Vth_H (the voltage V2) and the voltage Vout rises. Thus this operation enables the voltage Vout to boost to the voltage V2.

The voltage boosting circuit 40 has the inductor L and needs relatively large area. The flash memory chip 22 having the voltage boosting circuit 40 is considered to be larger in area. In the integrated circuit 10 described above, the interposer 30 disposed on the upper surface of the stacked structure 24 has the voltage boosting circuit 40. This arrangement enables to down-size the entire device in comparison to an integrated circuit that the flash memory chip 22 of the stacked structure 24 has the voltage boosting circuit 40 thereof. In high gain voltage boosting that the output voltage Vout is boosted at relatively high rate with respect to the input voltage Vin, using a charge pump that boosts an input voltage using a plurality of capacitances connected in parallel causes a large area or decrease of efficiency of voltage boosting because of need for more capacitances. Using the boost converter 42 enables to gain required voltage boosting performance by adjusting the inductor L, the capacitance CL and the resistance RL even if high gain voltage boosting is performed. This arrangement enables to down-size the entire device and to suppress decrease of efficiency in comparison to using the charge pump.

As described above, the interposer 30 disposed on the upper surface of the stacked structure 24 has the voltage boosting circuit 40. This arrangement enables to down-size the entire device. Using the boost converter as the voltage boosting circuit 40 enables to down-size the entire device in comparison to using the charge pump configured to be connected a plurality of capacitances in parallel with. The closer the output voltage Vout reaches to the voltage V2, the higher the oscillation frequency of the oscillator DCO is made to be.

This enables the output voltage Vout to being boosted slower. This arrangement desirably boosts the input voltage Vin to the voltage V2.

In the integrated circuit 10 of the embodiment, the transistor N2 is switched by the clock signal CLK that the frequency thereof varies three kinds of the frequencies. One modification may be switched by the clock signal CLK that the frequency thereof varies more than three kinds of the frequencies or that the frequency thereof varies less than three types of the frequencies. In the case, the configuration of the oscillator DCO of the switching control circuit 44 or the information stored in the register REG is changed properly with respect to a type of the clock signal CLK. This arrangement enables the type of the clock signal CLK to be changed.

In the integrated circuit 10 of the embodiment, the second circuit M2 is the same configuration as the third circuit M3, and the clock signal CLK with a duty ration of 0.5 is output by switching on or off of the switches SW1-SW5. The duty ratio of the clock signal CLK may be made larger than 0.5 or smaller than 0.5 by switching independently the switches SW1-SW5 of the second circuit M2 and the switches SW1-SW5 of the third circuit M3. In this case, the requirement is that the register REG stores on or off information of the switches SW1-SW5 of each circuits, that is, the second circuit M2 and the third circuit M3. The control logic circuit 46 outputs information of the duty ration of the clock signal CLK that should be output based on the output voltage VOUT. The selector SL reads out corresponding information of the switches SW1-SW5 of the second circuit M2 and the third Circuit M3 from the register REG based on the information from the control logic circuit 46 and switching the switches SW1-SW5 of the second circuit M2 and the third circuit M3 independently using the information read out.

Figure 6A:
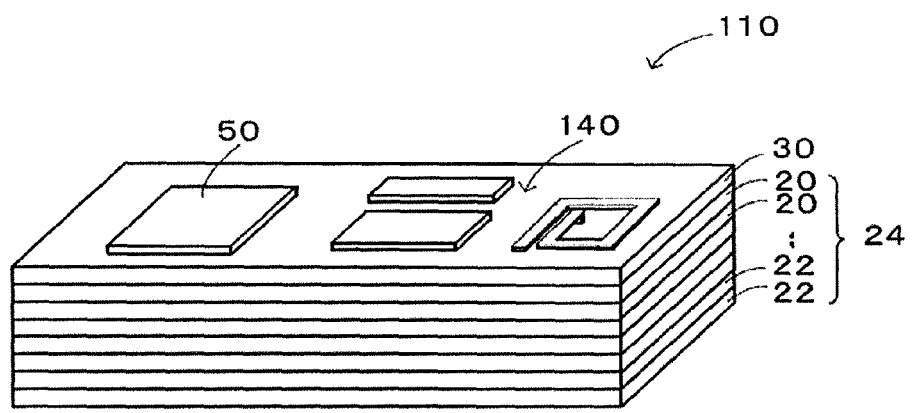
FIG. 6A schematically illustrates the configuration of an integrated circuit device 110, and FIG. 6B schematically illustrates the circuit of a voltage boosting circuit 140.

An integrated circuit device 110 of another embodiment is described below and shown in FIG. 6A. The integrated circuit device 110 is the same configuration as the integrated circuit device 10 except in the configuration a voltage boosting circuit 140. To avoid duplicate description, the components of the integrated circuit device 110 that is the same as the components of the integrated circuit device 10 are signed the same sign as that of the integrated circuit device 10. Detailed description is omitted.

Figure 6B:
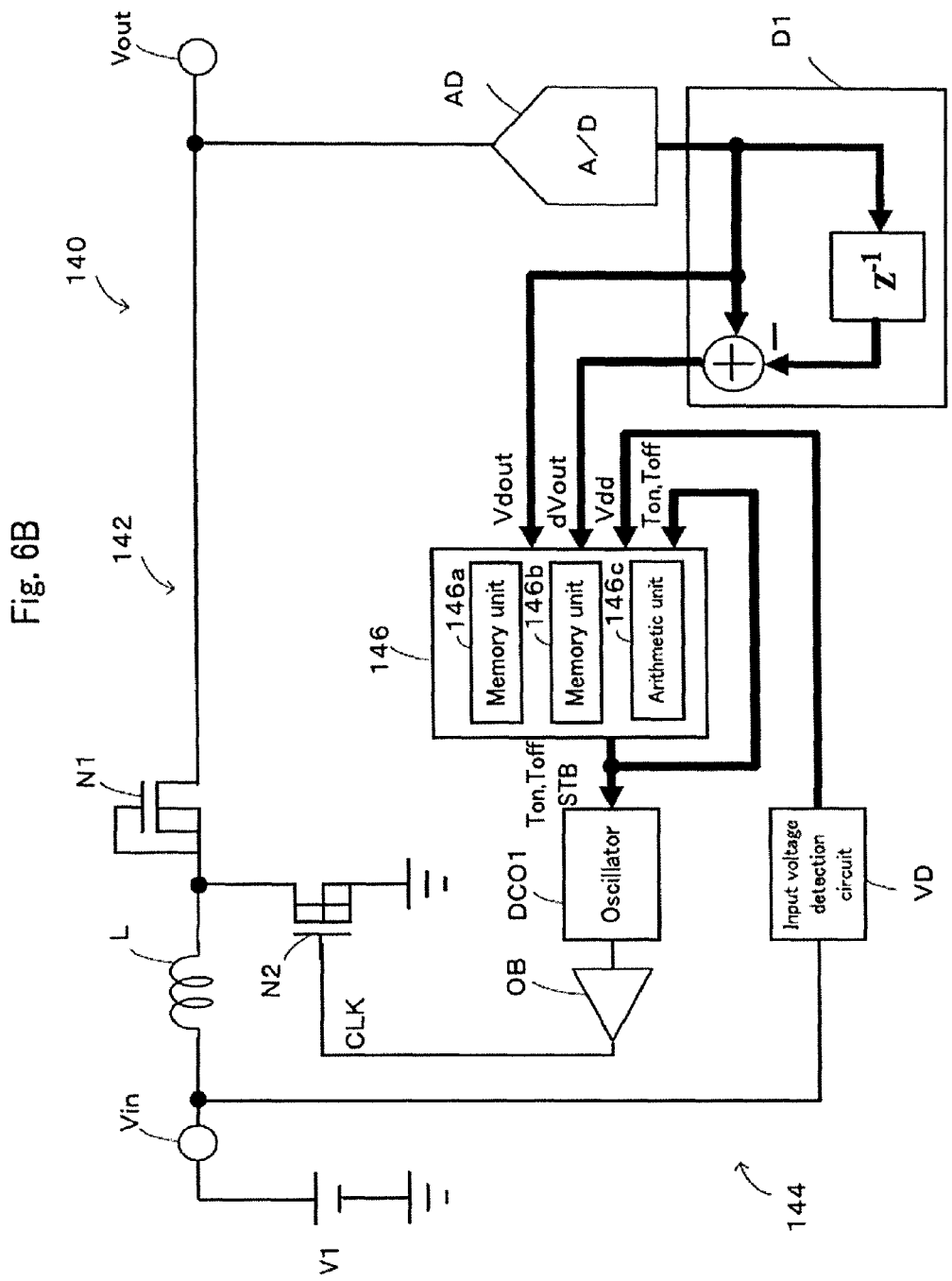

FIG. 6B schematically illustrates the circuit of the voltage boosting circuit 140. The voltage boosting circuit 140 has a boost converter 142 boosting a voltage V1 supplied from an input terminal Vin and outputting a boosted voltage to the flash memory from an output terminal Vout, and a switching control circuit 144 controlling the boost converter 142. The boost converter 142 has an inductor L connected in series between the input terminal Vin supplied the voltage V1 and the output terminal Vout outputting the voltage V2, a transistor N1 having a gate, a source connected with the gate and connected with the inductor L and a drain connected with the output terminal Vout, a transistor N2 connected in parallel with the output terminal Vout between the inductor L and the transistor N1 from a side of the inductor L. The switching of the transistor N2 is controlled by a clock signal CLK output from the switching control circuit 144.

The switching control circuit 144 has an oscillator DCO1 outputting the clock signal CLK, an output buffer OB inputting the clock signal CLK to the gate of the transistor N2 of the boost converter 142 at a proper timing, an A/D converter AD detecting an output voltage Vout of the output terminal Vout and converting the detected value to a digital value Vdout, an delay arithmetic circuit D1 carrying out an operation of a voltage varying amount dVout for one cycle of the clock signal CLK based on a difference between the output voltage Vout input from the A/D converter AD and a delay voltage Vdlay gained by delaying the output voltage Vout by a preset predefined time T as the time that is close to the cycle of the clock signal CLK, an input voltage detection circuit VD detecting an input voltage Vin of the input terminal Vin and converting the detected value to a digital value, and a control logic circuit 146 input the output voltage Vdout from the A/D converter AD, the voltage varying amount dVout from the delay arithmetic circuit D1 and the input voltage from the input voltage detection circuit VD, outputting and carrying out operation of on time Ton that is turned on the transistor N2 for one cycle of the clock signal CLK by the clock signal CLK that should be output from the oscillator DCO1 and off time that is turned off the transistor N2 for one cycle of the clock signal CLK, and outputting a stand-by signal STB for quitting an operation of the oscillator DCO.

The control logic 146 has memory units 146a and 146b being able to store information, an arithmetic unit 146c carrying out operation of the on time Ton and the off time Toff of the clock signal CLK using the information stored in the memory units 146a and 146b. In the memory unit 146a, the output voltage Vout, the voltage varying amount dVout, the input voltage Vin, a deduced load capacitance Cle that is deduced as a capacitance of a load connected with the output terminal Vout in such a way as to be described below is stored. In the memory unit 146b, a reference map is stored. The reference map shows a relationship between a load capacitance Cl connected with the output terminal and an on time Ton and off time Toff of the clock signal CLK that the consumption energy consumed by the boost converter 142 during boosting the output voltage from the voltage V1 to the voltage V2 is relatively low thereat with respect to the output voltage Vout. In the memory unit 146a, a value Cl (for example, 100 pF) as the deduced load capacitance Cle and a value Vref (for example, 1.8V) as the input voltage Vin are stored. The control logic circuit 146 outputs the stand-by signal to the oscillator DCO1 when the output voltage Vdout is equal to and higher than the predefined voltage V2.

Figure 7:
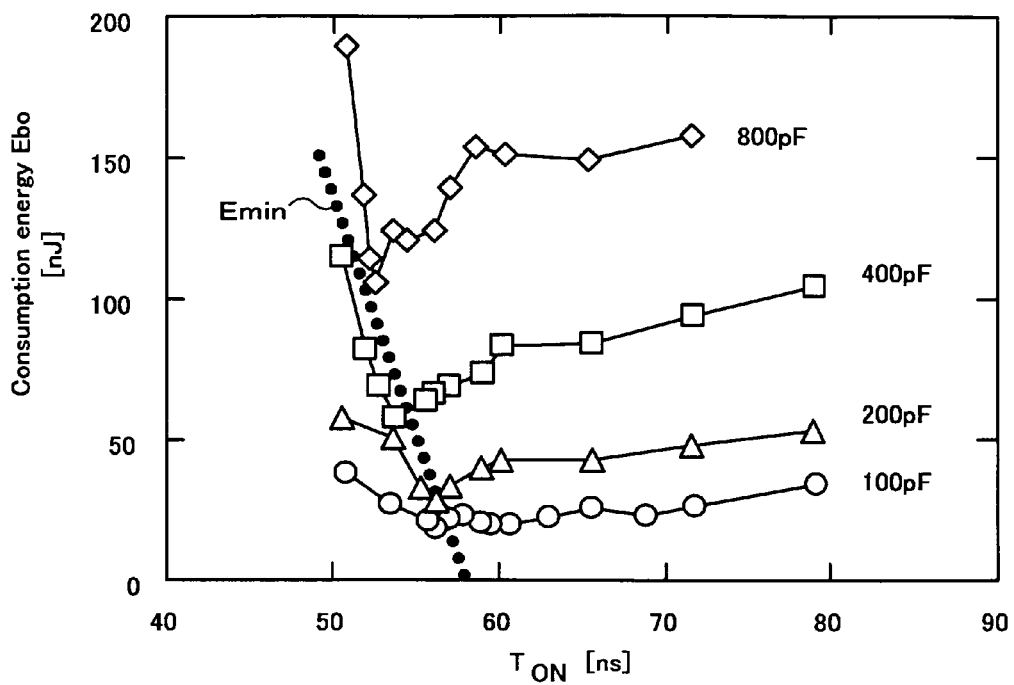
FIG. 7 schematically illustrates of a relationship of a load capacitance Cl connected with an output terminal Vout, an on time Ton, and a consumption energy Ebo during maintaining an input voltage Vin.
Figure 8:
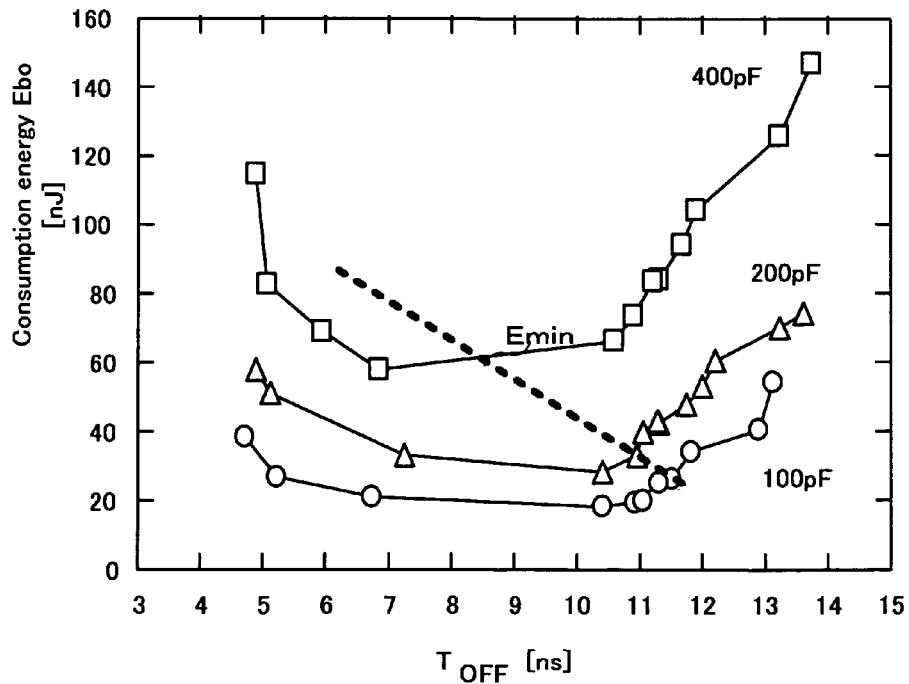
FIG. 8 schematically illustrates of a relationship of the load capacitance Cl, an off time Toff, and the consumption energy Ebo during maintaining the input voltage Vin.
Figure 9:
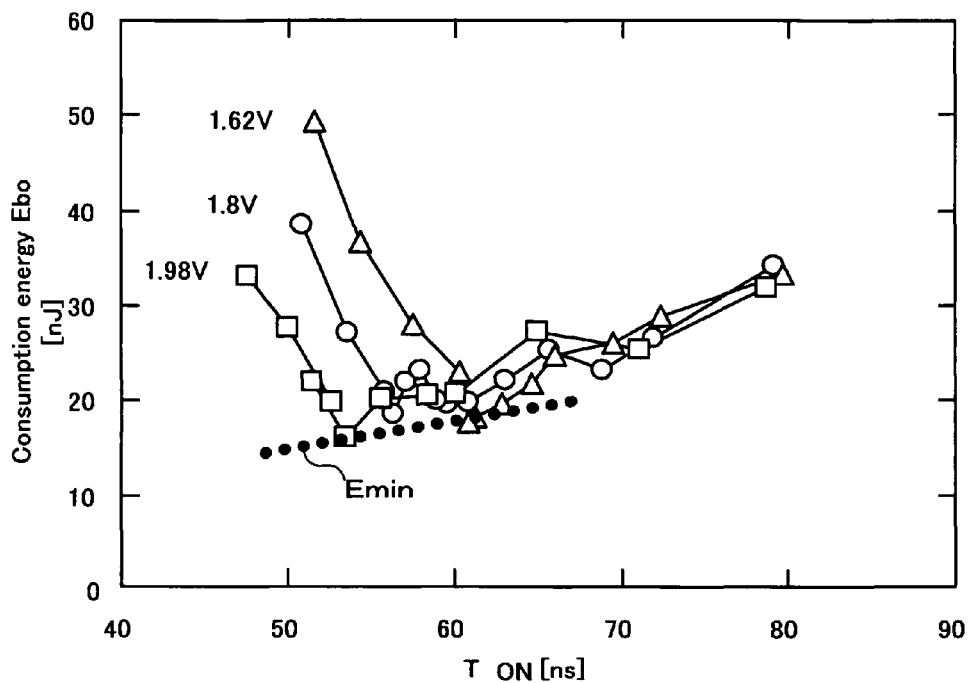
FIG. 9 schematically illustrates of a relationship of the input voltage Vin, the on time Ton, and the consumption energy Ebo during maintaining the load capacitance Cl.
Figure 10:
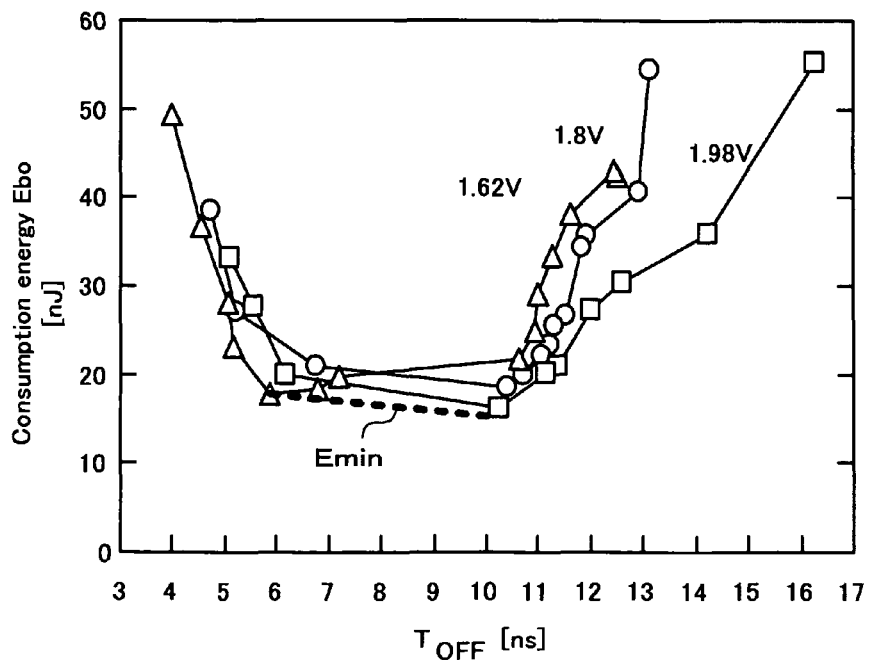
FIG. 10 schematically illustrates of a relationship of the input voltage Vin, the off time Toff, and the consumption energy Ebo during maintaining the load capacitance Cl.

The reference map stored in the memory unit 146b is described below. FIG. 7 schematically illustrates of a relationship of the load capacitance Cl connected with the output terminal Vout, the on time Ton, and a consumption energy Ebo during maintaining the input voltage Vin. FIG. 8 schematically illustrates of a relationship of the load capacitance Cl, the off time Toff, and the consumption energy Ebo during maintaining the input voltage Vin. The requirement is that the off time Toff in FIG. 7 is to be the time when the consumption energy Ebo becomes the lowest energy with respect to each load capacitance in FIG. 8. The requirement is that the on time Ton in FIG. 8 is to be the time when the consumption energy Ebo becomes the lowest energy with respect to each load capacitance in FIG. 7. In the case of the load capacitance maintained, the consumption energy Ebo, as shown by a diagram, becomes a minimum power Pmin at an on time Ton and an off time Toff. The larger the load capacitance Cl is, the longer the on time Ton and the off time Toff at minimum value Pmin is inclined to be. FIG. 9 schematically illustrates of a relationship of the input voltage Vin, the on time Ton, and the consumption energy Ebo during maintaining the load capacitance Cl. FIG. 10 schematically illustrates of a relationship of the input voltage Vin, the off time Toff, and the consumption energy Ebo during maintaining the load capacitance Cl. The requirement is that the off time Toff in FIG. 9 is to be the time when the consumption energy Ebo becomes the lowest energy with respect to each input voltage Vin in FIG. 10. The requirement is that the on time Ton in FIG. 10 is to be the time when the consumption energy Ebo becomes the lowest energy with respect to each input voltage Vin in FIG. 9. In the case of the input voltage maintained, the consumption energy Ebo, as shown by a diagram, becomes a minimum power Pmin at an on time Ton and an off time Toff. FIG. 11 schematically illustrates of a relationship of the load capacitance Cl, the on time Ton and the off time Toff that the consumption energy Ebo becomes a minimum value Emin at during maintaining the input voltage Vin (for example, 1.8V). FIG. 12 schematically illustrates of a relationship of the load capacitance Cl, the on time Ton and the off time Toff that the consumption energy Ebo becomes a minimum value Emin at during maintaining the load capacitance Cl (for example, 100 pF).

The voltage Vout can be boosted efficiently when the transistor N2 of the boost convertor 142 is switched by the clock signal CLK with the on time Ton and the off time Toff that the consumption energy Ebo becomes minimum value thereat with respect to the load capacitance Cl and the input voltage Vin, that is, frequency and duty ratio that the consumption energy Ebo becomes minimum value thereat. The reference map is to be the map derived by a prepared experiment or a prepared analysis as a relationship among the load capacitance Cl, the on time Ton and the off time Toff that the consumption energy Ebo becomes minimum value with respect to the input voltage Vin.

The arithmetic unit 146c of the control logic circuit 146 detects an increasing end timing when increase of the output voltage Vdout by the single switching ends. The arithmetic unit 146c carries out operation of deduced value dVe of the varying amount of the voltage generating when the transistor N2 is switched by the clock signal CLK with the on time Ton and the off time Toff with the output terminal Vout connected with the deduced load capacitance Cle. The arithmetic unit 146c compares the input varying amount of the voltage dVout to the operated deduced value dVe. The arithmetic unit 146c outputs the on time Ton and the off time Toff stored in the memory unit 146a to the oscillator DCO1 and stores the input voltage Vin and the output voltage Vdout into the memory unit 146a of the control logic circuit 146 when the input varying amount of the voltage dVout is equal to the operated deduced value dVe within the specified range (a difference between the varying amount of the voltage dVout and the deduced value dVe is lower than a specified value), that is, when a load with the deduced load capacitance Cle stored in the memory unit 146a is connected with the output terminal Vout. The arithmetic unit 146c sets a load capacitance that the varying amount of the voltage during switching the transistor N2 by the clock signal CLK with the on time Ton and the off time Toff is equal to the input varying amount of the voltage Vout thereat and outputs the on time Ton and the off time Toff to the oscillator DCO1 in reference to the reference map stored in the memory unit 146b when the input varying amount of the voltage dVout is not equal to the operated deduced value dVe within the specified range (a difference between the varying amount of the voltage dVout and the deduced value dVe is equal to or higher than the specified value), that is, when a load capacitance connected with the output terminal Vout is changed. For example, the arithmetic unit 146c sets a load capacitance that is lower than the load capacitance stored in the memory unit 146a as the deduced load capacitance Cle when the input varying amount of the voltage dVout is higher than the operated deduced value dVe. The output voltage Vdout, input voltage Vin, the newly set on time Ton, the newly set off time Toff and the newly set deduced load capacitance Cle are stored in the memory unit 146b in response to outputting the on time Ton and the off time Toff to the oscillator DCO1. Thus the control logic circuit 146 deduces the load capacitance connected with the output terminal Vout using the output voltage Vout, the input voltage Vin, the on time Ton, the off time Toff and the deduce load capacitance Cle in the voltage boost operation in the previous one cycle. The control logic circuit 146 outputs the on time Ton and the off time Toff that the boost convertor 142 is efficiently driven with respect to the deduced load capacitance (Cle) and the input voltage Vin to the oscillator DCO1. In the first voltage boost operation, the output voltage Vout, the input voltage Vin, the on time Ton, the off time Toff and the deduce load capacitance Cle in the voltage boost operation in the previous one cycle is not stored in the memory unit 146b. In this case, the control logic circuit 146 is to set the on time Ton and the off time Toff using the input voltage Vin input from the input voltage detection circuit VD, the output voltage Vout input from the A/D convertor AD and a capacitance Cref (for example, 100 pF) preliminarily stored in the memory unit 146b as the deduced load capacitance Cle and outputs the n time Ton and the off time Toff to the oscillator DCO1.

Figure 13:
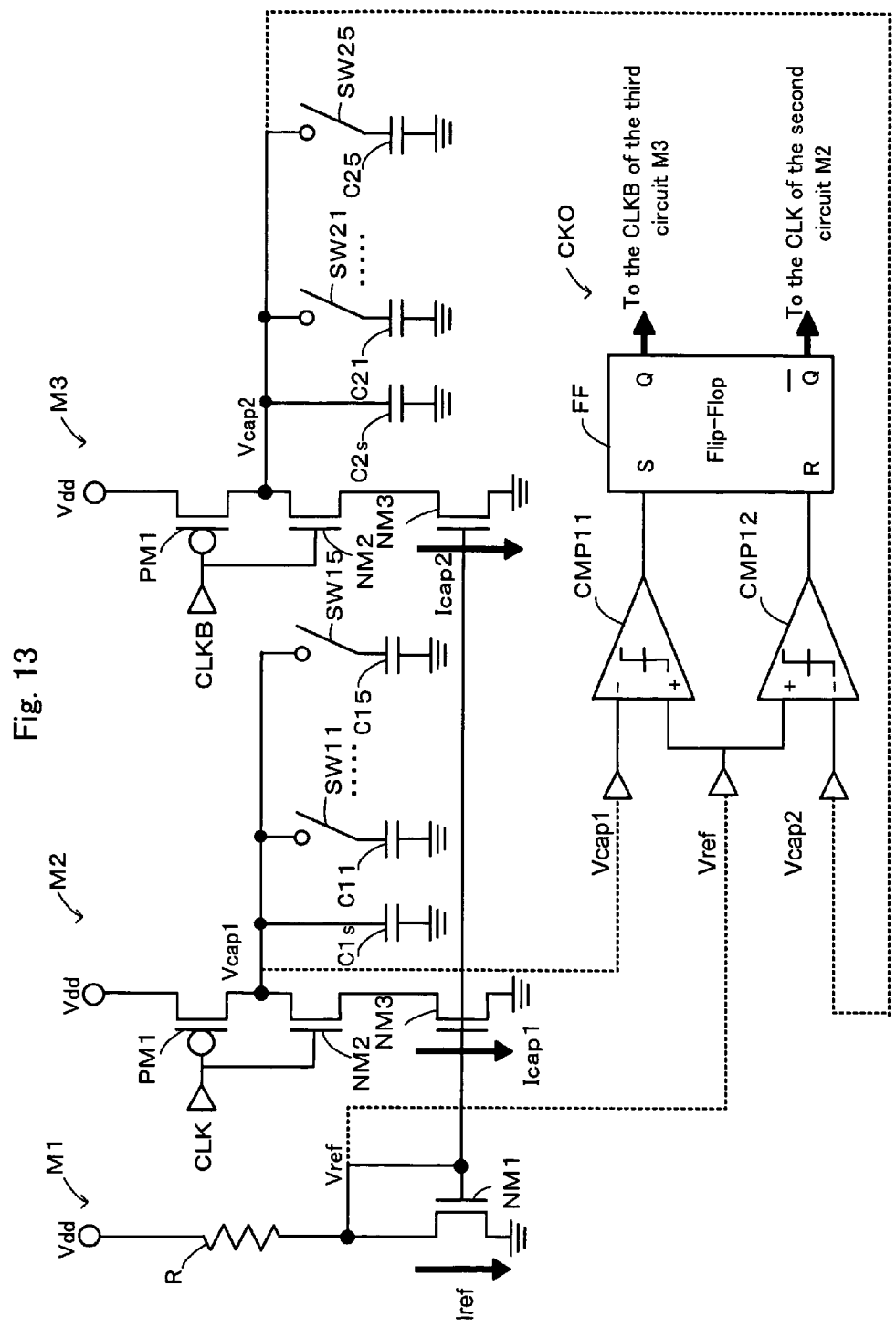
FIG. 13 schematically illustrates the circuit of an oscillator DCO1.

FIG. 13 schematically illustrates the circuit of the oscillator DCO1. The oscillator DCO1 is the same configuration as the oscillation DCO in the first embodiment except in the configuration that capacitances C1s and C2s is connected between a drain of the transistor PM1 of the second circuit M2 and the third circuit M3 and the ground without switches, the configuration that capacitances C11-C25 is connected between a drain of the transistor PM1 of the second circuit M2 and the third circuit M3 and the ground via switches SW11-SW25 controlled independently and the configuration that capacitances of the capacitances C11-C25 differ from each other. Frequency and duty ratio of the clock signal CLK output from the oscillator DCO1 are decided by the resistance value R of the resistance R, the capacitances C1s and C2s connected without switches in the second circuit M2 and the third circuit M3, and a synthesis capacitance of the capacitance connected with the switch turned on of the switches SW11-SW25. This arrangement enables to adjust the frequency and the duty ratio of the clock signal CLK to be output, that is, the on time Ton and the off time Toff based on the combination of on and off of the switches SW11-SW25. In this embodiment, the capacitances C1s and C2s are connected with the drain of the transistor PM1 without switches. The capacitances C1s and C2s may be connected with the drain of the transistor PM1. The capacitances C1s and C2s may be connected with the drain of the transistor PM1 via switches usually turned on.

Figure 14:
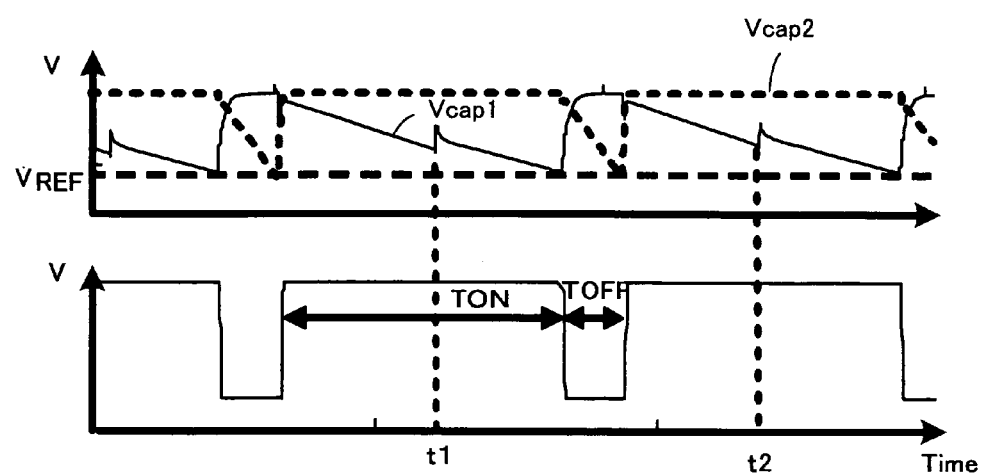
FIG. 14 schematically illustrates of time variation of a reference voltage Vref, a capacitance voltage Vcap1 (solid line) and Vcap2 (dash line), and a voltage of the clock signal CLK.

The on time Ton and the off time Toff of the clock signal CLK is calculated using formula (4) and (5) as described below. In the formula (4), Cln indicates a synthesis capacitance of the capacitance connected with the switch turned on of the switches SW11-SW15 of the second circuit M2, and C2n indicates a synthesis capacitance of the capacitance connected with the switch turned on of the switches SW21-SW25 of the third circuit M3. FIG. 14 schematically illustrates of time variation of a reference voltage Vref that is a voltage between the drain of the transistor NM1 of the first circuit M1 of the oscillator DCO1 and the ground, a capacitance voltage Vcap1 (solid line) that is a voltage between the drain of the transistor PM1 of the second circuit M2 and the ground, a capacitance voltage Vcap2 (dash line) that is a voltage between the drain of the transistor PM1 of the third circuit M3 and the ground, and a voltage of the clock signal CLK. The oscillator DCO1 begins to output the clock signal CLK with the switches SW11-SW25 turned off. The oscillator DCO1 switches on or off of the switches SW11-SW25 with respect to the on time Ton and the off time Toff in response to output of the on time Ton and the off time Toff from the control logic circuit 146 (for example, times t1 or t2 in the figure). The reason for this operation is that the setting the on time Ton and the off time Toff by the control logic circuit 146 require substantial time. The capacitances C1s and C2s is connected with the transistor PM1 without the switches, and the on time Ton that is the time for setting the on time Ton and the off time Toff by the control logic circuit 146 is set aside. The time required for setting the on time Ton and the off time Toff by the control logic circuit 146 can be preset based on performance of the control logic circuit 146. The capacitance values of the capacitances C1s and C2s are decided based on The time required for setting the on time Ton and the off time Toff by the control logic circuit 146 etc. This arrangement of the oscillator DCO1 enables to output desired on time Ton and off time Toff of the clock signal CLK.

$$Ton=(Cls+Cln)\cdot(Vdd-Vcap1)/Iref=R\cdot(Cls+Cln) \quad (4)$$

$$Toff=(Cls+Cln)\cdot(Vdd-Vcap2)/Iref=R\cdot(C2s+C2n) \quad (5)$$

Figure 15:
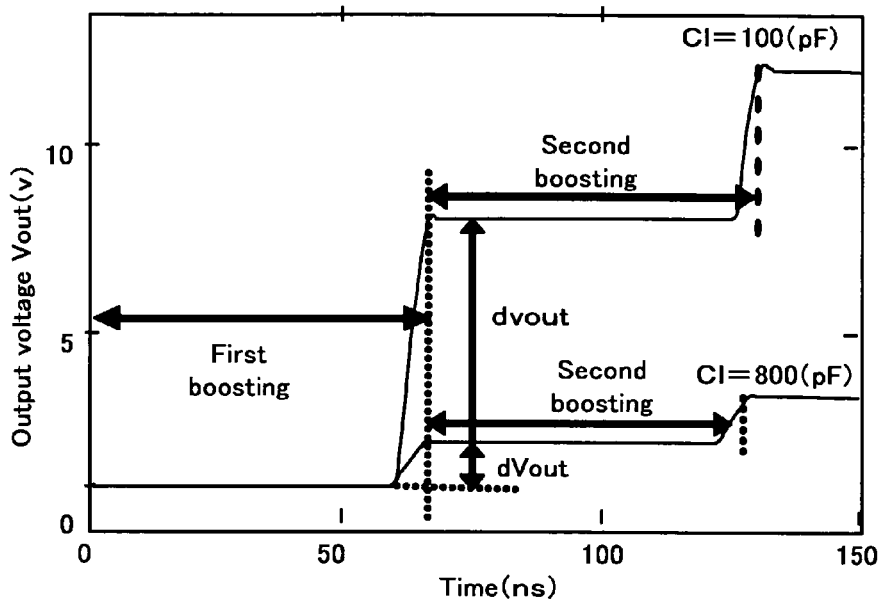
FIG. 15 schematically illustrates of time variation of an output voltage Vout and the clock signal CLK during a first boosting and a second boosting after the beginning of a boosting with the load capacitance Cl 100 pF or with the load capacitance Cl 800 pF.
Figure 16:
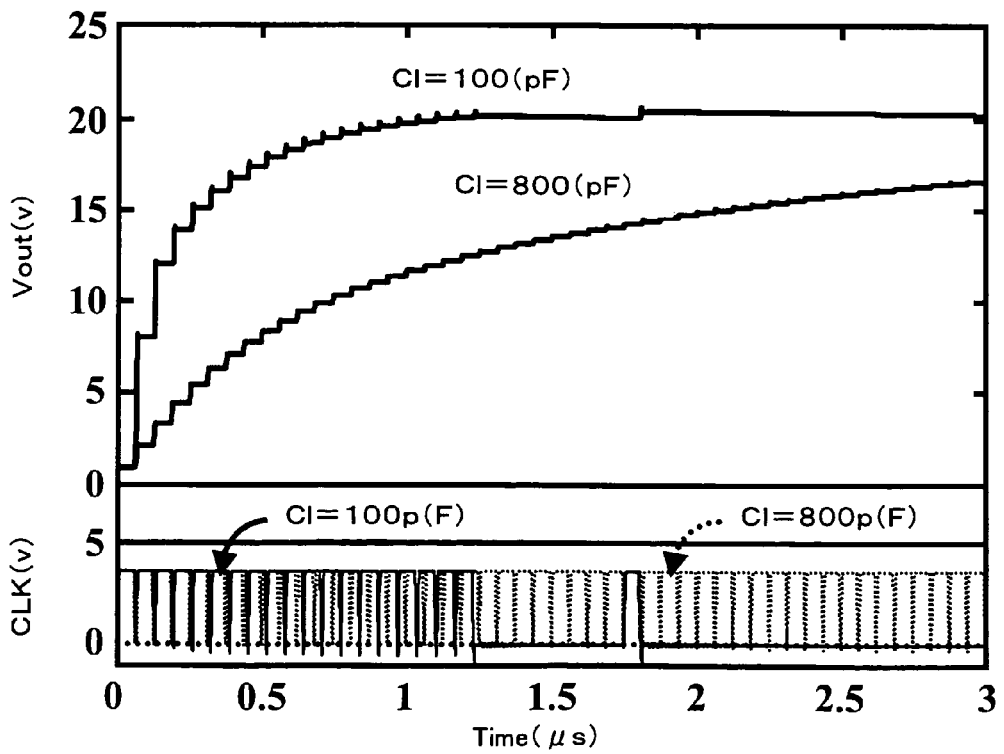
FIG. 16 schematically illustrates of time variation of the output voltage Vout and the clock signal CLK output from a switching control circuit 144 for 3 micron second from beginning of a boosting with the load capacitance Cl 100 pF or with the load capacitance Cl 800 pF.

An operation of the voltage boosting circuit 140 is described below. FIG. 15 schematically illustrates of time variation of the output voltage Vout and the clock signal CLK during a first boosting and a second boosting after the beginning of a boosting with the load capacitance Cl 100 pF or with the load capacitance Cl 800 pF. FIG. 16 schematically illustrates of time variation of the output voltage Vout and the clock signal CLK output from a switching control circuit 144 for 3 micron second from beginning of a boosting with the load capacitance Cl 100 pF or with the load capacitance Cl 800 pF. In response to supply the voltage Vin to the input terminal Vin and the beginning of the voltage boost operation, the control logic circuit 146 of the switching control circuit 144 sets the on time Ton and the off time Toff using the input voltage Vin from the input voltage detection circuit VD, the output voltage Vdout from the A/D converter AD, the deduced load capacitance Cle (of the value Cref) stored in the memory unit 146b. The control logic circuit 146 outputs the on time Ton and the off time Toff to the oscillator DCO1. The control logic circuit 146 stored the output voltage Vdout input voltage Vin, the set on time Ton, the set off time Toff and the deduce load capacitance Cle in the memory unit 146a. The oscillator DCO1 input the on time Ton and the off time Toff switches the switches SW11-SW25 so that switches with respect to the input on time Ton and the input off time Toff of the switches SW11-SW25 is only turned on. In response to this switching, the oscillator DCO1 inputs the clock signal CLK with the set on time Ton and the set off time Toff to a gate of the transistor N2 of the boost converter 142 via the output buffer OB. The transistor N2 is switched once by the clock signal CLK with the set on time Ton and the set off time Toff. Thus the first boost operation ends. In the first boost operation, the load capacitance CL is deduced to be the value Cref, and the clock signal CLK with the on time Ton and the off time Toff that the boost convertor 142 is efficiently driven with respect to the load capacitance Cl, that is, with frequency and duty ratio that the boost convertor 142 is efficiently driven is input to the gate of the transistor N2. Thus the voltage boost operation is carried out. In the case of maintaining the input voltage Vin, in spite of the load capacitance Cl actually connected with the output terminal Vout, the load capacitance Cl is deduced to be 100 pF and the first voltage boost operation is carried out. This causes the on time Ton to be the same as the off time Toff.

Following that, subsequent voltage boost operation is begun. In the subsequent voltage boost operation, the control logic circuit 146 of the switching control circuit 144 carries out operation of deduced value dVe of the varying amount of the voltage, compares the varying amount of the voltage dVout from the delay arithmetic circuit D1 to the operated deduced value dVe, and outputs the on time Ton and the off time Toff with respect to result of the comparison to the oscillator DCO1. When the load capacitance Cl is 100 pF, the varying amount of the voltage dVout generated in the first voltage boost operation is the same as deduced value dVe of the varying amount of the voltage when the deduced load capacitance Cle is 100 pF. The switching of the transistor N2 is performed by the clock signal CLK with the on time Ton and the off time Toff that the boost convertor 142 is efficiently driven during the load capacitance being 100 pF. When the load capacitance Cl is 800 pF, the varying amount of the voltage dVout generated in the first voltage boost operation is lower than the deduced value dVe of the varying amount of the voltage. The deduced load capacitance Cl is set as larger capacitance (for example, 800 pF) based on the varying amount of the voltage dVout generated in the first voltage boost operation. The switching of the transistor N2 is performed by the clock signal CLK with the on time Ton and the off time Toff with respect to the deduced load capacitance Cl and the input voltage Vin. Thus, in the subsequent voltage boost operation, the load capacitance actually connected is deduced based on the voltage boost operation in the previous one cycle. This arrangement enables to boost the voltage Vout of the output terminal Vout to the specified voltage V2 driving the boost convertor 142 efficiently with respect to the deduce load capacitance Cl and the input voltage Vin.

In the voltage boost operation, the stand-by signal STB is output from the control logic circuit 146 when the voltage Vout rises to reach the specified voltage V2. The oscillation action of the oscillator DCO1 input the stand-by signal STB is stopped, and the voltage boost operation of the voltage boosting circuit 140 is stopped. This operation, in spite of the variation of the load capacitance or the input voltage Vin, enables to boost the voltage Vout driving the oscillator DCO1 efficiently till the voltage Vout reaches to the specified voltage V2, and enables to increase the energy efficiency of the boost convertor 142. Especially, in the case of putting the integrated circuit 110 in a CPU (Central Processing Unit) carrying out memory interleave, load capacitance connected with the output terminal Vout seems to vary during boosting voltage by the voltage boosting circuit 140 owing to switching memory bank of the flash memory that the voltage is to be supplied to. In this case, the output voltage Vout can be desirably efficiency boosted.

The voltage boosting circuit 140 has the inductor L and needs relatively large area. The flash memory chip 22 having the voltage boosting circuit 140 is considered to be larger in area. In the integrated circuit 110 described above, the interposer 30 disposed on the upper surface of the stacked structure 24 has the voltage boosting circuit 140. This arrangement enables to down-size the entire device in comparison to an integrated circuit that the flash memory chip 22 of the stacked structure 24 has the voltage boosting circuit 140 thereof. In high gain voltage boosting that the output voltage Vout is boosted at relatively high rate with respect to the input voltage Vin, using a charge pump that boosts an input voltage using a plurality of capacitances connected in parallel causes a large area or decrease of efficiency of voltage boosting because of need for more capacitances. Using the boost converter 42 enables to gain required voltage boosting performance by adjusting the inductor L, the capacitance CL and the resistance RL even if high gain voltage boosting is performed.

This arrangement enables to down-size the entire device and to suppress decrease of efficiency in comparison to using the charge pump.

As described above, the interposer 30 disposed on the upper surface of the stacked structure 24 has the voltage boosting circuit 40. This arrangement enables to down-size the entire device. Using the boost converter as the voltage boosting circuit 140 enables to down-size the entire device in comparison to using the charge pump configured to be connected a plurality of capacitances in parallel with. The load capacitance actually connected is deduced. This arrangement enables to boost the voltage Vout of the output terminal Vout to the specified voltage V2 driving the boost convertor 142 efficiently with respect to the deduce load capacitance Cl and the input voltage Vin.

In the integrated circuit device 110, the reference map is to be stored in the memory unit 146b of the control logic circuit 146. The on time Ton and the off time Toff that are the time when the consumption energy Ebo becomes minimum value with respect to the input voltage Vin may be operated by formula. The formula presetting the relationship between the load capacitance Cl, the on time Ton, and the off time Toff is preliminary derived from experiments or analysis. The on time Ton and the off time Toff are the time when the consumption energy Ebo becomes minimum value with respect to the input voltage Vin.

In the integrated circuit device 110, the oscillator DCO1 is to be switching the switches SW11-SW25 with respect to the on time Ton and the off time Toff at the timing of being output the on time Ton and the off time Toff from the control logic 146. The oscillator DCO1 may be to be switching the switches SW11-SW25 with respect to the on time Ton and the off time Toff at the timing of turning off the transistor N2.

In the integrated circuit device 110, the transistor N2 is to be switched by the clock signal CLK with the on time Ton and the off time Toff that drive the boost converter 142 efficiently derived with respect to the deduced load capacitance and the input voltage. The clock signal CLK may be to have the on time Ton and the off time Toff that drive the boost converter 142 efficiently with respect only to the deduced load capacitance, without respect to the input voltage, or with respect only to the input voltage, without respect to the deduced load capacitance.

Figure 17:
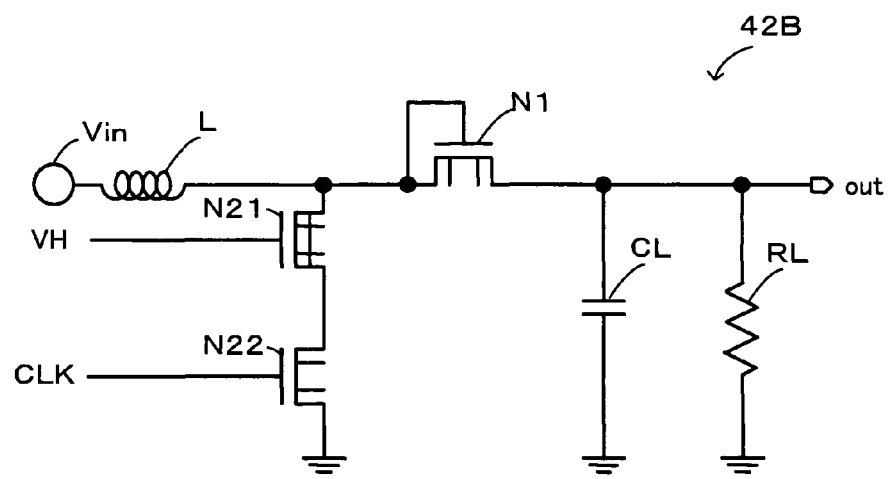
FIG. 17 schematically illustrates the configuration of a boost convertor of another modified structure.

In the integrated circuit device 10 or 110, the boost converters 42 and 142 have the transistor N2 connected in parallel with the output terminal Vout between the inductor L and the transistor N1 from a side of the inductor L. The requirement is that the boost converters 42 and 142 have the switching element connected in parallel with the output terminal Vout between the inductor L and the transistor N1 from a side of the inductor L. FIG. 17 schematically illustrates the configuration of a boost convertor 42B of another modified structure. The boost converters 42B may be to have, in place of the depletion-type NMOS transistor N2, a depletion-type NMOS transistor N21 (described below as a transistor N21) connected between the inductor L and the transistor N1 from a side of the inductor L and a enhancement-type NMOS transistor N22 (described below as a transistor N22) connected in series with the transistor N21. In this case, a gate voltage of the transistor N21 may be to be maintained to a predefined voltage VH, and the clock signal CLK may be to be input to a gate of the transistor N22. The predefined voltage VH is to be desirably the voltage between the voltage V1 and the voltage V2 (for example, 3.6V). The boost converters 42 and 142 have an enhancement-type NMOS transistor N1 having a gate, a source connected with the gate and connected with the inductor L and a drain connected with the output terminal Vout. The requirement is that the boost converters 42 and 142 have a rectifying element connected in series between the inductor L and the output terminal Vout and rectifies current to an direction from the input terminal Vin to the output terminal Vout. The boost converters 42 and 142 may be to have a diode in place of the transistor N1.

In the integrated circuit device 10 or 110, the flash memory chip 22 operates at the voltage V1 that is equal to the power-supply voltage and at the voltage V2 that is higher than the voltage V1. The flash memory chip 22 may be to operate at the voltage V3 that is higher than the power-supply voltage and is lower than the voltage V2. In this case, the interposer 30 may be to have a voltage boost circuit boosting the voltage V1 to the voltage V3 with the voltage boost circuit 40 or 140.

In the integrated circuit device 10 or 110, the interposer 30 is disposed on an upper surface of the stacked structure 24. The interposer 30 may be to be disposed on a lower surface. The other integrate circuit or interposer may be to be stacked on the interposer 30.

In the embodiment described above, the integrated circuit device 10 or 110 is used for the SSD, and the stacked structure 24 is formed by stacking a plurality of the DRAM chip 20 and a plurality of the flash memory chip 22. The integrated circuit device 10 or 100 may be to be used for the other device that is different from the SSD. For example, the integrated circuit device may be to be used for a micro computer, and the stacked structure may be to be formed by stacking a plurality of a chip equipped with MPU (Micro Processing Unit)d a plurality of the flash memory chip 22. The integrated circuit device may be to be used for an electronic device except of a computer.

The embodiment discussed above is to be considered in all aspects as illustrative and no restrictive. There may be many modifications, changes, and alternative without departing from the scope or spirit of the main characteristics of the present invention. The scope and spirit of the present invention are indicated by the appended claims, rather than by the foregoing description.

INDUSTRIAL APPLICABILITY

The technique of the present invention is preferably applied to the manufacturing industries of integrated circuit device.

The invention claimed is:

1. An integrated circuit device comprising:
a stacked structure formed by stacking a plurality of integrated circuit chips including a first integrated circuit chip having a first integrated circuit operated at a first voltage,
wherein an interposer is disposed on an end surface of the stacked structure and has a voltage boosting supply circuit for boosting a specified voltage supplied from a power supply to the first integrated circuit chip within the stacked structure, the voltage boosting supply circuit comprises:
a boost converter having an inductor connected in series between an input terminal supplied with the specified voltage and an output terminal supplying the first voltage, a rectifying element connected in series between the inductor and the output terminal and rectifying current in a direction from the input terminal to the output terminal, a switching element connected between the inductor and the rectifying element and connected in parallel with the output terminal as viewed from the inductor, a capacitor connected between the rectifying element and the output terminal and connected in parallel with the output terminal as viewed from the rectifying element, and a resistor connected between the rectifying element and the output terminal and connected in parallel with the output terminal as viewed from the rectifying element; and a switching control circuit controlling switching of the switching element.

2. The integrated circuit device in accordance with claim 1, wherein the switching control circuit controls the switching element so that the switching of the switching element is performed at a frequency adjusted for varying a voltage of the output terminal into the first voltage.

3. The integrated circuit device in accordance with claim 2, wherein the switching control circuit controls the switching element so that the switching of the switching element is performed at a frequency adjusted to a tendency to rise by rising of the voltage of the output terminal.

4. The integrated circuit device in accordance with claim 3, wherein the switching control circuit controls the switching element so that the switching of the switching element is performed at a first frequency while the voltage of the output terminal varies from the specified voltage to a first control voltage that is higher than the specified voltage and lower than the first voltage, controls the switching element so that the switching of the switching element is performed at a second frequency that is higher than the first frequency during the time between when the voltage of the output terminal reaches the first control voltage and when the voltage of the output terminal reaches a second control voltage that is higher than the first control voltage and lower than the first voltage, controls the switching element so that the switching of the switching element is performed at a third frequency that is higher than the second frequency during the time between when the voltage of the output terminal reaches the second control voltage and when the voltage of the output terminal reaches the first voltage, controls the switching element so that the switching of the switching element is stopped after the voltage of the output terminal reaches the first voltage, and controls the switching element so that the switching of the switching element is performed at the third frequency while the voltage of the output terminal varies to the first voltage when the voltage of the output terminal reduces to the second control voltage after reaching the first voltage.

5. The integrated circuit device in accordance with claim 1, wherein the switching element is an enhancement-type n-type metal oxide semiconductor transistor having a drain connected with the inductor and having a source grounded.

6. The integrated circuit device in accordance with claim 1, wherein the switching element comprises:

a depletion-type n-type metal oxide semiconductor transistor having a drain connected with the inductor; and an enhancement-type n-type metal oxide semiconductor transistor having a drain connected with a source of the depletion-type n-type metal oxide semiconductor transistor and a source grounded.

7. The integrated circuit device in accordance with claim 1, wherein the rectifying element is an enhancement-type n-type metal oxide semiconductor transistor having a gate and a source connected with the inductor and a drain connected with the capacitor.

8. The integrated circuit device in accordance with claim 1, wherein the first integrated circuit is a flash memory.

9. An integrated circuit device comprising:

a stacked structure formed by stacking a plurality of integrated circuit chips including a first integrated circuit chip having a first integrated circuit operated at a first voltage, wherein an interposer is disposed on an end surface of the stacked structure and has a voltage boosting supply circuit for boosting a specified voltage supplied from a power supply to the first integrated stacked structure, the voltage boosting supply circuit comprises:

a boost converter having an inductor connected in series between an input terminal supplied with the specified voltage and an output terminal supplying the first voltage, a rectifying element connected in series between the inductor and the output terminal and rectifying current in a direction from the input terminal to the output terminal, and a switching element connected between the inductor and the rectifying element and connected in parallel with the output terminal as viewed from the inductor; and a switching control circuit controlling switching of the switching element by using a pulse signal.

10. The integrated circuit device in accordance with claim 9, wherein the switching control circuit comprises:

a voltage detection unit for detecting an output voltage that is the voltage of the output terminal;

a voltage varying amount detection unit detecting a varying amount of the output voltage when one period amount of the pulse signal is applied to the switching element; and a switching control unit deducing a load capacitance connected with the output terminal by using a frequency and a duty ratio of the pulse signal, the detected output voltage and the detected varying amount of the output voltage, and for controlling the switching of the switching element by using an adjusted pulse signal with a frequency and a duty ratio adjusted so that the output voltage becomes the first voltage and the boost converter can be driven efficiently with respect to the deduced load capacitance.

11. The integrated circuit device in accordance with claim 10, wherein the switching control circuit comprises:

a first memory unit storing a deducing load capacitance that is the deduced load capacitance, the detected output voltage, and the frequency and the duty ratio of the pulse signal; and a second memory unit storing a preset specified relationship with respect to the load capacitance and the output voltage that is a relationship of the frequency and the duty ratio of the pulse signal with energy consumed by the boost converter becoming a relatively low value thereat until the output voltage becomes the first voltage;

wherein the switching control unit, until the detected output voltage becomes the first voltage, deduces a voltage varying amount of the output terminal when the switching of the switching element is controlled with a load having the deduced capacitance stored in the first memory unit connected with the output terminal using the pulse signal with the frequency and the duty ratio stored in the first memory unit, controls the switching of the switching element by using the pulse signal with the frequency and the duty ratio stored in the first memory unit and stores the detected output voltage in the first memory unit when a difference between the detected voltage varying amount and the deduced voltage varying amount of the output terminal is lower than a specified value, deduces the load capacitance by using the detected voltage varying, sets the frequency and the duty ratio of the pulse signal with the boost converter being driven efficiently thereat by using the deduced load capacitance and the specified relationship stored in the second memory unit, controls the switching of the switching element by using the pulse signal with the set frequency and the set duty ratio, and stores the deduced load capacitance, the frequency and the duty ratio of the pulse signal and the detected output voltage in the first memory unit; and the switching control unit stops the switching of the switching element after the voltage of the output terminal reaches the first voltage.

12. The integrated circuit device in accordance with claim 9, wherein the switching control circuit comprises a voltage detection unit for detecting a voltage of the input terminal and the switching control unit controls the switching of the switching element by using an adjusted pulse signal with a frequency and a duty ratio adjusted with respect to the detected voltage so that the boost converter can be driven efficiently.

13. The integrated circuit device in accordance with claim 9, wherein the first integrated circuit is a flash memory.

14. An integrated circuit device comprising:
a stacked structure formed by stacking a plurality of integrated circuit chips including a first integrated circuit chip having a first integrated circuit operated at a first voltage and at a second voltage different from the first voltage,
wherein an interposer is disposed on an end surface of the stacked structure and has a voltage boosting supply circuit for boosting a specified voltage supplied from a power supply to the first integrated circuit chip within the stacked structure, the interposer having a second voltage boosting supply circuit boosting the specified voltage to the second voltage and supplying the second voltage to the first integrated circuit of the first integrated circuit chip within the stacked structure.

15. An integrated circuit device comprising:
a stacked structure formed by stacking a plurality of integrated circuit chips including a first integrated circuit chip having a first integrated circuit operated at a first voltage, and a second integrated circuit chip having a second integrated circuit operated at a second voltage different from the first voltage,
wherein an interposer is disposed on an end surface of the stacked structure and has a voltage boosting supply circuit for boosting a specified voltage supplied from a power supply to the first integrated circuit chip within the stacked structure, the interposer having a second voltage boosting supply circuit boosting the specified voltage to the second voltage and supplying the second voltage to the second integrated circuit of the second integrated circuit chip within the stacked structure.

* * * * *